(12) United States Patent
Kim et al.

(10) Patent No.: US 9,330,781 B2
(45) Date of Patent: May 3, 2016

(54) NONVOLATILE MEMORY DEVICE AND MEMORY SYSTEM INCLUDING THE SAME

(71) Applicant: SAMSUNG ELECTRONICS CO., LTD., Suwon-Si, Gyeonggi-Do (KR)

(72) Inventors: Sungjun Kim, Seoul (KR); Sangtae Kim, Hwaseong-si (KR); Byunghoon Jeong, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/546,039

(22) Filed: Nov. 18, 2014

(65) Prior Publication Data
US 2015/0287475 A1    Oct. 8, 2015

(30) Foreign Application Priority Data

Apr. 7, 2014    (KR) .......................... 10-2014-0041152

(51) Int. Cl.
    G11C 17/18    (2006.01)
    G11C 17/16    (2006.01)
(52) U.S. Cl.
    CPC .............. G11C 17/18 (2013.01); G11C 17/165 (2013.01)
(58) Field of Classification Search
    CPC .............................. G11C 17/18; G11C 17/165
    USPC ............. 365/96, 225.7, 189.15, 189.2, 189.5, 365/200, 201
    See application file for complete search history.

(56) References Cited

U.S. PATENT DOCUMENTS

| 6,256,237 | B1* | 7/2001 | Ho ........................ G11C 29/44 365/149 |
| 7,016,247 | B2 | 3/2006 | Murakuki et al. |
| 7,715,246 | B1* | 5/2010 | Kim ........................ G11C 7/18 365/189.05 |
| 8,339,830 | B2 | 12/2012 | Yamauchi et al. |
| 8,339,868 | B2 | 12/2012 | Miyatake |
| 8,483,002 | B2 | 7/2013 | Shin et al. |
| 2009/0180307 | A1* | 7/2009 | Kurjanowicz .......... G11C 17/10 365/96 |
| 2010/0238741 | A1* | 9/2010 | Miyatake ................. 365/189.05 |
| 2013/0083612 | A1* | 4/2013 | Son .................... G11C 29/4401 365/200 |
| 2013/0215696 | A1 | 8/2013 | Choi et al. |
| 2014/0078842 | A1* | 3/2014 | Oh ........................ G11C 29/785 365/200 |

FOREIGN PATENT DOCUMENTS

| JP | 2008-159183 | 7/2008 |
| JP | 2013-101731 | 5/2013 |
| KR | 1019980055754 | 9/1998 |
| KR | 1020020010823 | 2/2002 |
| KR | 1020040098897 | 11/2004 |

* cited by examiner

*Primary Examiner* — Vu Le
*Assistant Examiner* — Sung Cho
(74) *Attorney, Agent, or Firm* — F. Chau & Associates, LLC

(57) ABSTRACT

A nonvolatile memory device is provided. The nonvolatile memory device includes a memory cell array, an anti-fuse cell array, a sense amplifier, a page buffer, and a control logic. The memory cell array includes memory cells connected to word lines and bit lines. The anti-fuse cell array stores setting information for controlling the memory cell array. The anti-fuse cell array includes anti-fuse cells connected to the bit lines. The sense amplifier is connected to the bit lines to sense the memory cells or the anti-fuse cells. The page buffer stores data that is read out from the memory cells or the anti-fuse cells. The control logic controls the sense amplifiers and the page buffer to read out data from the memory cell array or the anti-fuse cell array.

16 Claims, 15 Drawing Sheets

NONVOLATILE MEMORY DEVICE AND MEMORY SYSTEM INCLUDING THE SAME

CROSS-REFERENCE TO RELATED APPLICATION

This U.S. non-provisional patent application claims priority under 35 U.S.C. §119 to Korean Patent Application No. 10-2014-0041152, filed on Apr. 7, 2014, in the Korean Intellectual Property Office, the disclosure of which is incorporated by reference herein in its entirety.

TECHNICAL FIELD

The present inventive concept herein relates to a semiconductor memory device, and more particularly, to a nonvolatile memory device, and a memory system including the same.

DISCUSSION OF THE RELATED ART

Semiconductor memory devices may be classified into volatile semiconductor memory devices and nonvolatile semiconductor memory devices. The volatile memory devices lose their stored data when their power supplied to the volatile memory devices are interrupted. Examples of the volatile memory devices include a static random access memory (SRAM), a dynamic random access memory (DRAM), etc. The nonvolatile memory devices retain their stored data even when their power supplied to the nonvolatile memory devices are interrupted. Examples of the nonvolatile memory devices include a programmable read only memory (PROM), an electrically programmable read only memory (EPROM), a flash memory device, etc.

Recently, semiconductor memory devices such as a ferroelectric random access memory (FRAM), a magnetic random access memory (MRAM), and a phase-change random access memory (PRMA) have been developed using materials of which resistance values are changed depending on levels of currents or voltages. Thus, such semiconductor devices may retain the resistance values even when there are interruptions to their power.

SUMMARY

According to an embodiment of the present inventive concept, a nonvolatile memory device is provided. The nonvolatile memory device includes a memory cell array, an anti-fuse cell array, a sense amplifier, a page buffer, and a control logic. The memory cell array includes memory cells connected to word lines and bit lines. The anti-fuse cell array is configured to store setting information for controlling the memory cell array. The anti-fuse cell array includes anti-fuse cells connected to the bit lines. The sense amplifier is connected to the bit lines. The sense amplifier is configured to sense the memory cells or the anti-fuse cells. The page buffer is configured to store data read out from the memory cells or the anti-fuse cells. The control logic is configured to control the sense amplifiers and the page buffer to read out data from the memory cell array or the anti-fuse cell array.

The anti-fuse cell array may be located between the memory cell array and the sense amplifier on a substrate.

The sense amplifier may be located between the memory cell array and the anti-fuse cell array on a substrate.

The nonvolatile memory device may further include a reference voltage supply circuit configured to supply a reference voltage to the sense amplifier.

In case of reading out data stored in the memory cells, the reference voltage supply circuit may be configured to supply a first reference voltage to the sense amplifier.

In case of reading out data stored in the anti-fuse cells, the reference voltage supply circuit may be configured to supply to the sense amplifier a second reference voltage that is different from the first reference voltage.

The nonvolatile memory device may further include a bias current supply circuit and a bias voltage supply circuit. The bias current supply circuit may be configured to supply a bias current to the sense amplifier. The bias voltage supply circuit may be configured to supply a bias voltage to the bias current supply circuit.

In case of reading out data stored in the memory cells, the bias voltage supply circuit may be configured to supply a first bias voltage to the bias current supply circuit.

In case of reading out data stored in the anti-fuse cells, the bias voltage supply circuit may be configured to supply to the bias current supply circuit a second bias voltage that is different from the first bias voltage.

According to an embodiment of the present inventive concept, a memory system is provided. The memory system includes a nonvolatile memory device and a memory controller. The memory controller is configured to control the nonvolatile memory device. The nonvolatile memory device includes a memory cell array, an anti-fuse cell array, a sense amplifier, a page buffer, and a control logic. The memory cell array includes a plurality of memory cells connected to word lines and bit lines. The anti-fuse cell array is configured to store setting information for controlling the memory cell array. The anti-fuse cell array includes anti-fuse cells connected to the bit lines. The plurality of anti-fuse cells is configured to store information with respect to failed memory cells of the memory cell array. The sense amplifier is connected to the bit lines. The sense amplifier is configured to sense the memory cells and the anti-fuse cells. The page buffer is configured to store data read out from the memory cells or the anti-fuse cells. The control logic is configured to control the sense amplifiers and the page buffer to read out data from the memory cell array or the anti-fuse cell array The control logic is configured to perform a repair operation of the memory cell array based on the information stored in the plurality of anti-fuse cells.

Each of the plurality of memory cells may include a memory element and a select element.

The nonvolatile memory device may further include an address decoder configured to select one of the word lines according to address information in case of reading out data stored in the plurality of memory cells.

The sense amplifier may be configured to sense the data stored in memory cells connected to a selected word line among the plurality of memory cells.

The control logic may be configured to select one of anti-fuse word lines connected to the plurality of anti-fuse cells according to address information in case of reading out data stored in the plurality of anti-fuse cells.

The sense amplifier may be configured to sense the data stored in anti-fuse cells connected to a selected anti-fuse word line among the plurality of anti-fuse cells.

According to an embodiment of the present inventive concept, a solid state drive is provided. The solid state drive includes a nonvolatile memory device and a controller. The controller is configured to control the nonvolatile memory device. The nonvolatile memory device includes a memory cell array, a sense amplifier, an anti-fuse cell array, and a control logic. The sense amplifier is configured to sense data stored in the memory cell array. The anti-fuse cell array is configured to store control information for controlling the memory cell array. The anti-fuse cell array is configured to share the sense amplifier with the memory cell array. The control logic is configured to control the sense amplifier to read out data from the memory cell array or the anti-fuse cell array.

The sense amplifier may be connected to at least one of a plurality of memory cells in the memory cell array and at least one of a plurality of anti-fuse cells in the anti-fuse cell array.

The control logic may be configured to select one of anti-fuse word lines connected to the plurality of anti-fuse cells according to address information in case of reading out data stored in at least one of the plurality of anti-fuse cells.

The sense amplifier may be configured to sense the data stored in anti-fuse cells connected to a selected anti-fuse word line among the plurality of anti-fuse cells.

The control information may be unchanged after the anti-fuse cell array is programmed once.

BRIEF DESCRIPTION OF THE FIGURES

Embodiments of the present inventive concept will be described below in more detail with reference to the accompanying drawings. The embodiments of the present inventive concept may, however, be embodied in different forms and should not be constructed as limited to the embodiments set forth herein. Rather, these embodiments are provided so that this disclosure will be thorough and complete, and will fully convey the scope of the present inventive concept to those skilled in the art. Like numbers refer to like elements throughout.

DETAILED DESCRIPTION OF THE EMBODIMENTS

Figure 1:
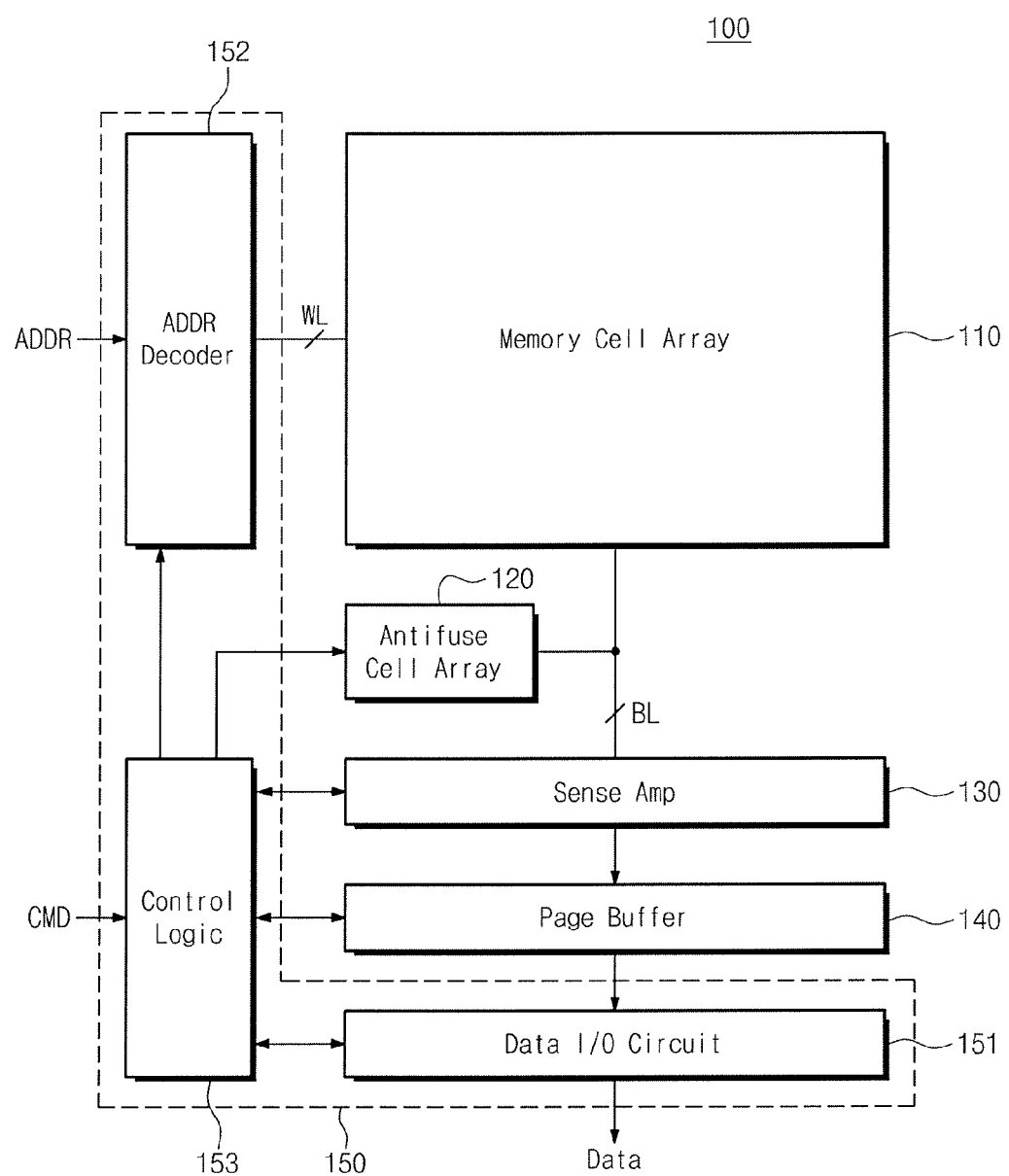
FIG. 1 is a block diagram of a nonvolatile memory device in accordance with an embodiment of the present inventive concept.

Embodiments of the present inventive concept will be described more fully hereinafter with reference to the accompanying drawings, in which embodiments of the present inventive concept are shown. The present inventive concept may, however, be embodied in many different forms and should not be construed as limited to the embodiments set forth herein. Rather, these embodiments are provided so that this inventive concept will be thorough and complete, and will fully convey the scope of the present inventive concept to those skilled in the art. In the drawings, the size and relative sizes of layers and regions may be exaggerated for clarity. Like numbers may refer to like elements throughout.

A variable resistance memory device will be used as an example of a storage device or an electronic device for explaining a feature or function of the present inventive concept. A feature of the present inventive concept is described by assuming that a data unit being moved is a sector unit but the data unit is not limited to the sector unit. Those skilled in the art will readily appreciate functions of the present inventive concept by the described contents. A PRAM is described as a storage medium but other nonvolatile memory devices may be used as a storage medium. For example, an MRAM, an ReRAM, an FRAM, a flash memory, etc may be used as a storage medium, and they may be applied to a memory system in which different kinds of memory devices are mixed.

FIG. 1 is a block diagram of a nonvolatile memory device 100 in accordance with an embodiment of the present inventive concept. Referring to FIG. 1, a nonvolatile memory device 100 may include a memory cell array 110, an anti-fuse cell array 120, a sense amplifier 130, a page buffer 140, and a peripheral circuit 150. The peripheral circuit 150 may include a data input/output circuit 151, an address decoder 152, and control logic 153.

The memory cell array 110 may include a plurality of word lines WL and a plurality of bit lines BL, and memory cells may be disposed at places where the plurality of word lines WL and the plurality of bit lines BL cross one another.

The anti-fuse cell array 120 may include a plurality of anti-fuse cells. The plurality of anti-fuse cells may include information to control the nonvolatile memory device 100. For example, the plurality of anti-fuse cells can store information with respect to failed memory cells of the memory cell array 110. The control logic 153 can perform a repair operation of the memory cell array 110 according to information stored in the anti-fuse cell array 120. The anti-fuse cell array 120 can store set values for driving the nonvolatile memory device 100.

The anti-fuse cell may be a resistive fuse device. The anti-fuse cell may have a high resistance (e.g., 100 MΩ) in a state that the anti-fuse cell is not programmed, and a low resistance (e.g., less than 100 MΩ) after the program operation of the anti-fuse cell. For example, the anti-fuse cell may include a thin dielectric material having several angstroms to several hundreds of angstroms, such as a compound in which dielectric such as silicon dioxide (SiO2), silicon nitride, tantalum oxide, ONO (silicon dioxide-silicon nitride-silicon dioxide), or the like is disposed between two conductive materials.

A program operation of the anti-fuse cell can be performed by applying a high voltage (e.g., 10V) through anti-fuse terminals for long time enough to destroy dielectric between two conductors. Thus, if the anti-fuse cell is programmed, conductors of both ends of the anti-fuse cell may be shorted and thereby a resistance value of the anti-fuse cell may become smaller. Thus, a basic state of the anti-fuse is electrically an open state, and if a high voltage is applied to the anti-fuse and then the anti-fuse cell is programmed, the anti-fuse may become in an electrically shorted state. The information to control the nonvolatile memory device 100 is not changed after the anti-fuse cell is programmed once.

The anti-fuse cell array 120 can share bit lines BL with the memory cell array 110. Thus, the anti-fuse cell array 120 may not need a separate sense amplifier. The anti-fuse cell array 120 can share the sense amplifier 130 with the memory cell array 110. Data stored in anti-fuse cells can be read out through the sense amplifier 130. Thus, a separate area for a separate sense amplifier of the anti-fuse cell array 120 may be reduced. If the anti-fuse cell array 120 shares the sense amplifier 130 with the memory cell array 110, a path of reading out data stored in the anti-fuse cell array 120 can be shortened. Thus, time of reading out data stored in the anti-fuse cell array 120 can be shortened.

The sense amplifier 130 can operate according to a control of the control logic 153. The sense amplifier 130 may be configured to read memory cells connected to selected bit lines BL and word lines WL that are selected by the address decoder 152. In case of reading out data stored in the memory cells, the address decoder 152 may select one of the word lines according to address information. The sense amplifier 130 can read the memory cells by sensing currents flowing through the selected bit lines or voltages applied to the selected bit lines. The sense amplifier 130 can output read data to the page buffer 140.

The page buffer 140 can operate according to the control of the control logic 153. The page buffer 140 can transmit data read out through the sense amplifier 130 to the data input/output circuit 151. The page buffer 140 can also transmit data read out from the anti-fuse cell array 120 to the control logic 153.

The data input/output circuit 151 can operate according to the control of the control logic 153. The data input/output circuit 151 can output data from the page buffer 140 to an external device.

The address decoder 152 may be configured to operate the control of the control logic 153. The address decoder 152 can receive an address ADDR from the external device. The address decoder 152 may be configured to decode a row address among the received addresses ADDR. Using the decoded row address, the address decoder 152 can select a word line WL. The address decoder 152 can transmit various voltages being used in a read operation to word lines WL, respectively.

The address decoder 152 may be configured to decode a column address among the transmitted addresses ADDR. The decoded column address DCA can be transmitted to the sense amplifier 130. The address decoder 152 may include a row decoder, a column decoder, an address buffer, etc.

The control logic 153 can output control signals for controlling the nonvolatile memory device 100 according to a command signal CMD provided from the external device. The control logic 153 can control an operation of the sense amplifier 130 in the read operation. The control logic 153 can provide a reference voltage Vref for comparing with a voltage of a sensing line SL to the sense amplifier 130 in the read operation. In the read operation, the control logic 153 can select a word line WL and a bit line BL by controlling the address decoder 152 and can temporarily store data of the selected memory cell in the corresponding page buffer 140 by controlling the page buffer 140.

The control logic 153 can control the address decoder 152 according to data read out from the anti-fuse cell array 120. For example, the control logic 153 can replace a word line including a failed memory cell with other word line according to data read out from the anti-fuse cell array 120.

Figure 2:
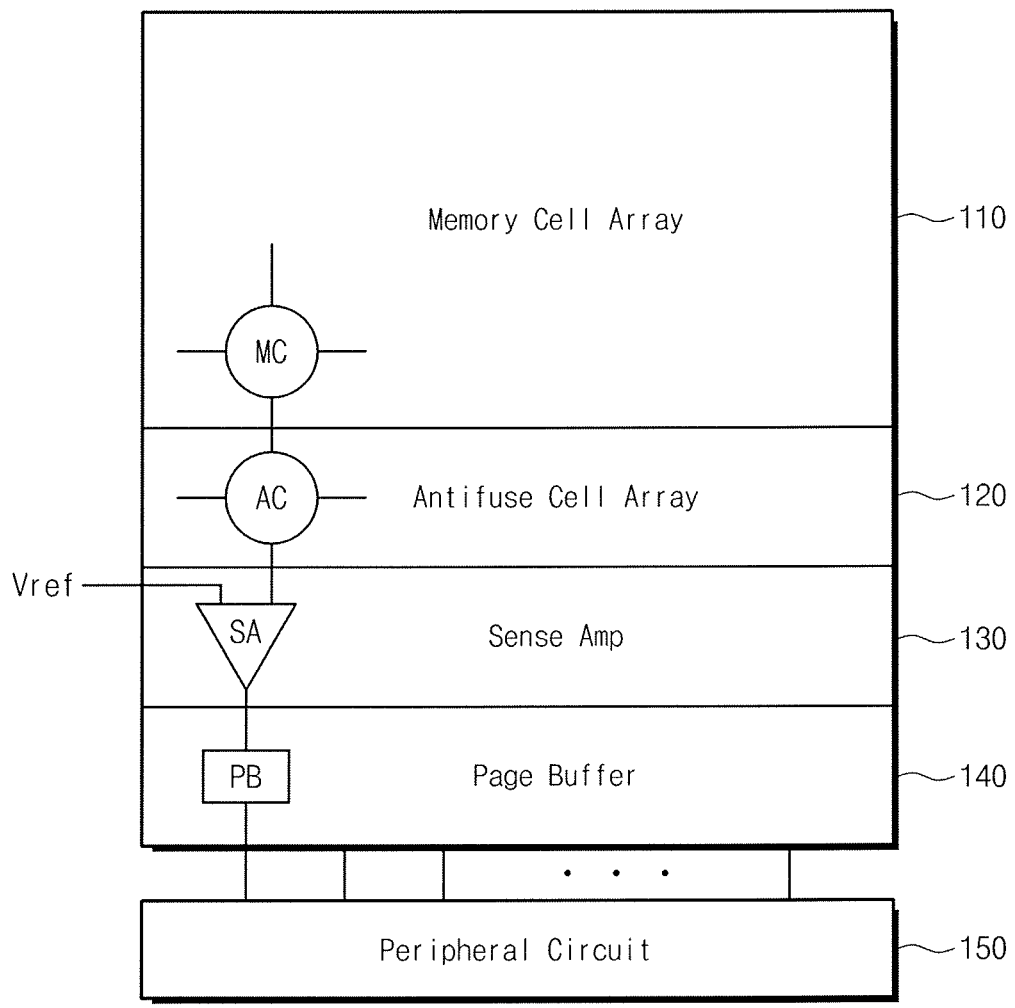
FIG. 2 is a top plan view illustrating the nonvolatile memory device of FIG. 1 in accordance with an embodiment of the present inventive concept.

FIG. 2 is a top plan view illustrating the nonvolatile memory device of FIG. 1 in accordance with an embodiment of the present inventive concept. Referring to FIG. 2, the anti-fuse cell array 120 may be located between the memory cell array 110 and the sense amplifier 130 on a substrate. A memory cell MC and an anti-fuse cell AC can share one bit line BL. Thus, data stored in the memory cell MC and the anti-fuse cell AC can be read out through one sense amplifier SA. Since a separate sense amplifier for the anti-fuse cell AC is not needed, an area of the nonvolatile memory device 100 can be reduced. Data stored in the memory cell MC or the anti-fuse cell AC can be read out by comparing a reference voltage Vref with a voltage or a current of the memory cell MC or the anti-fuse cell AC. The read out data can be transmitted to the peripheral circuit 150 through a corresponding buffer page BP. The read out data can be output to the external device through the data input/output circuit 151 of the peripheral circuit 150.

Figure 3:
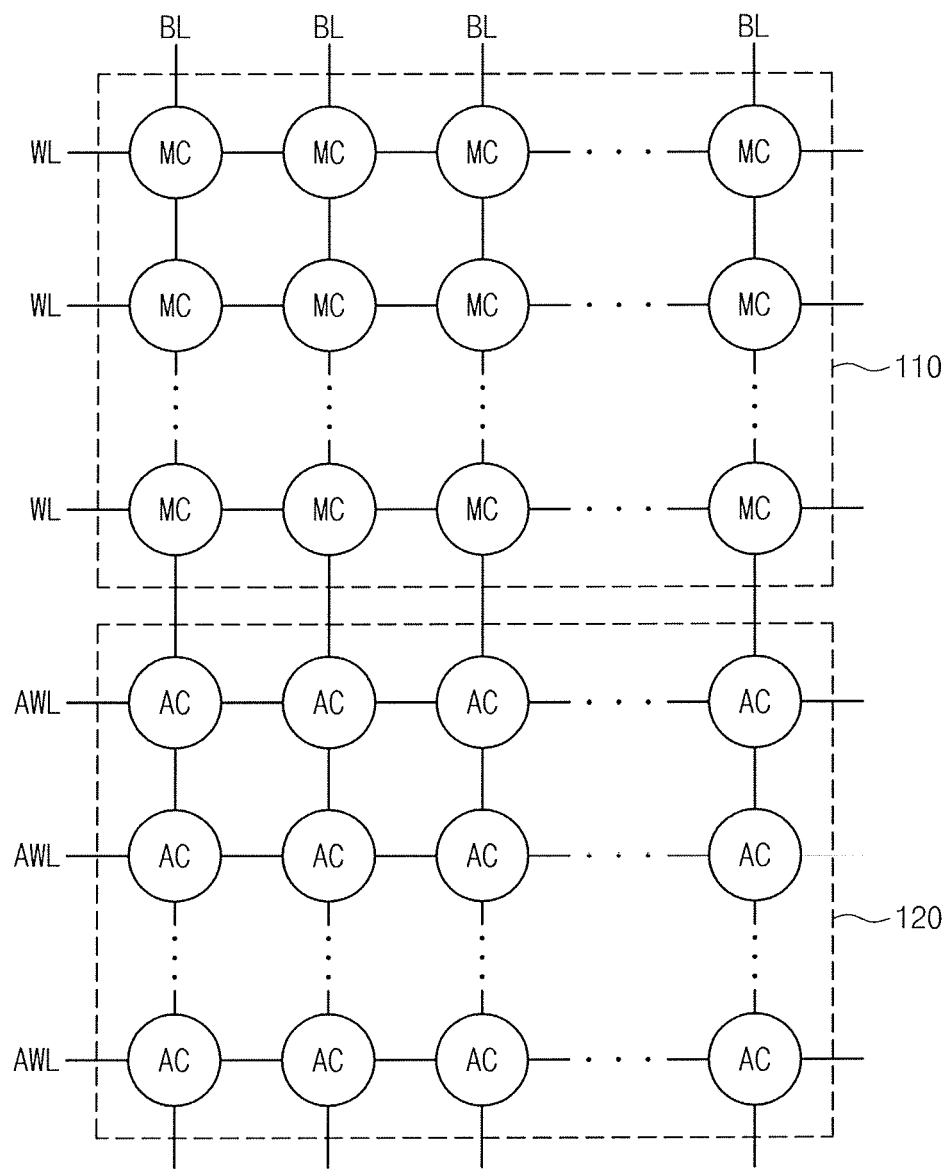
FIG. 3 is a diagram illustrating a memory cell array and an anti-fuse cell array illustrated in FIG. 2 in accordance with an embodiment of the present inventive concept.
Figure 4:
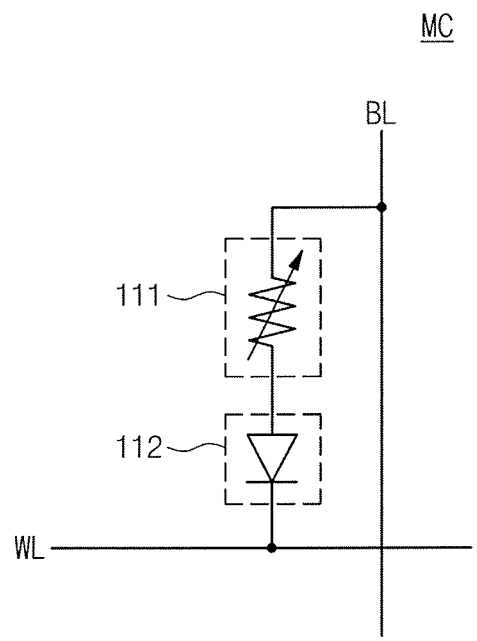
FIG. 4 is a circuit diagram illustrating a memory cell illustrated in FIG. 3 in accordance with an embodiment of the present inventive concept.
Figure 5:
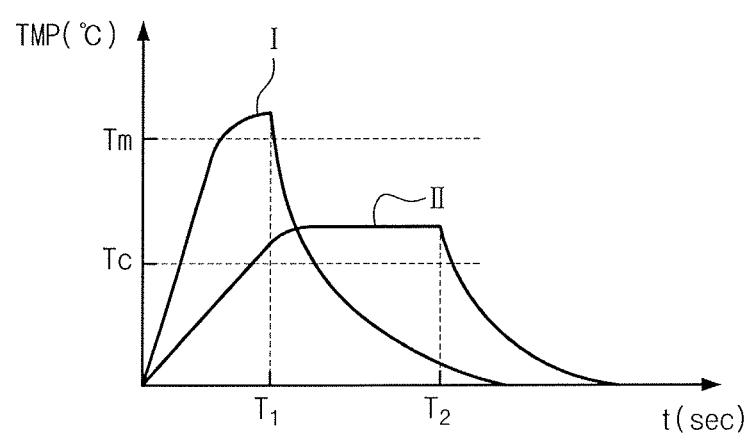
FIG. 5 is a graph for explaining a characteristic of a phase change material in accordance with an embodiment of the present inventive concept.

FIG. 3 is a diagram illustrating a memory cell array and an anti-fuse cell array illustrated in FIG. 2 in accordance with an embodiment of the present inventive concept. FIG. 4 is a circuit diagram illustrating a memory cell illustrated in FIG. 3 in accordance with an embodiment of the present inventive concept. FIG. 5 is a graph explaining a characteristic of a phase change material in accordance with an embodiment of the present inventive concept.

First, referring to FIGS. 3 and 4, a memory cell array 110 can be connected to a plurality of word lines WL and a plurality of bit lines BL. An anti-fuse cell array 120 can be connected to a plurality of anti-fuse word lines AWL and the plurality of bit lines BL. Memory cells MC may be disposed at places where the plurality of word lines WL and the plurality of bit lines BL cross one another. Anti-fuse cells AC may be disposed at places where the plurality of anti-fuse word lines AWL and the plurality of bit lines BL cross one another. A part of the memory cells MC and a part of the anti-fuse cells AC can share a corresponding bit line BL. In case of reading out data stored in the memory cells MC, the address decoder 152 (FIG. 1) may select one of the plurality of word lines WL according to address information. In case of reading out data stored in the anti-fuse cells AC, the control logic 153 (FIG. 1) may select one of the plurality of anti-fuse word lines AWL connected to anti-fuse cells AC according to address information.

For example, the memory cells MC may be phase change memory cells. Each of the memory cells MC may include a memory element 111 and a select element 112 as illustrated in FIG. 4. The memory element 111 may include a phase change material GST.

A resistance of the phase change material GST (e.g., Ge—Sb—Te) may be changed depending on a temperature. The phase change material GST may have one of two stable states (for example, a crystal state and an amorphous state). The phase change material GST may be changed to a crystal state or an amorphous state depending on a current being supplied to a bit line BL. A phase change memory device can program data using a characteristic of the phase change material GST.

In an embodiment of the present inventive concept, the select element 112 can be constituted by a diode. An anode of the diode may be connected to the memory element 111 and a cathode of the diode may be connected to a word line WL. If a voltage difference between the anode of the diode and the cathode of the diode is higher than a threshold voltage, the diode may be turned on. If the diode is turned on, the memory element 111 may be supplied with a current through a bit line BL. Although not illustrated in the drawings, the select element 112 may be implemented based on a transistor.

Referring to FIG. 5, if a temperature of the phase change material GST is down after it has been heated up to a temperature higher than a melting temperature Tm for a certain period of time T1, the phase change material GST may be changed to an amorphous state (I). If the temperature of the phase change material GST is down after it has been heated up to a temperature that is lower than a melting temperature Tm and higher than a crystallization temperature Tc for a certain period of time T2, the phase change material GST may be changed to a crystal state (II). Resistivity of the phase change material GST having the amorphous state may be higher than resistivity of the phase change material GST having the crystal state. Thus, in a read mode, by sensing a current flowing through the phase change material GST, it can be distinguished whether information stored in the phase change material GST is logical "1" or logical "0". A current to heat the phase change material GST to the amorphous state is referred to as a reset current.

Characteristics (e.g., an operation speed, an integration, a reset current level, etc.) of the memory cells described above may be determined by a concentration of metallic doping included in a variable resistance material. The characteristics of the memory cells described above may be determined by structures (for example, a multilayer structure) of the memory cells.

Figure 6:
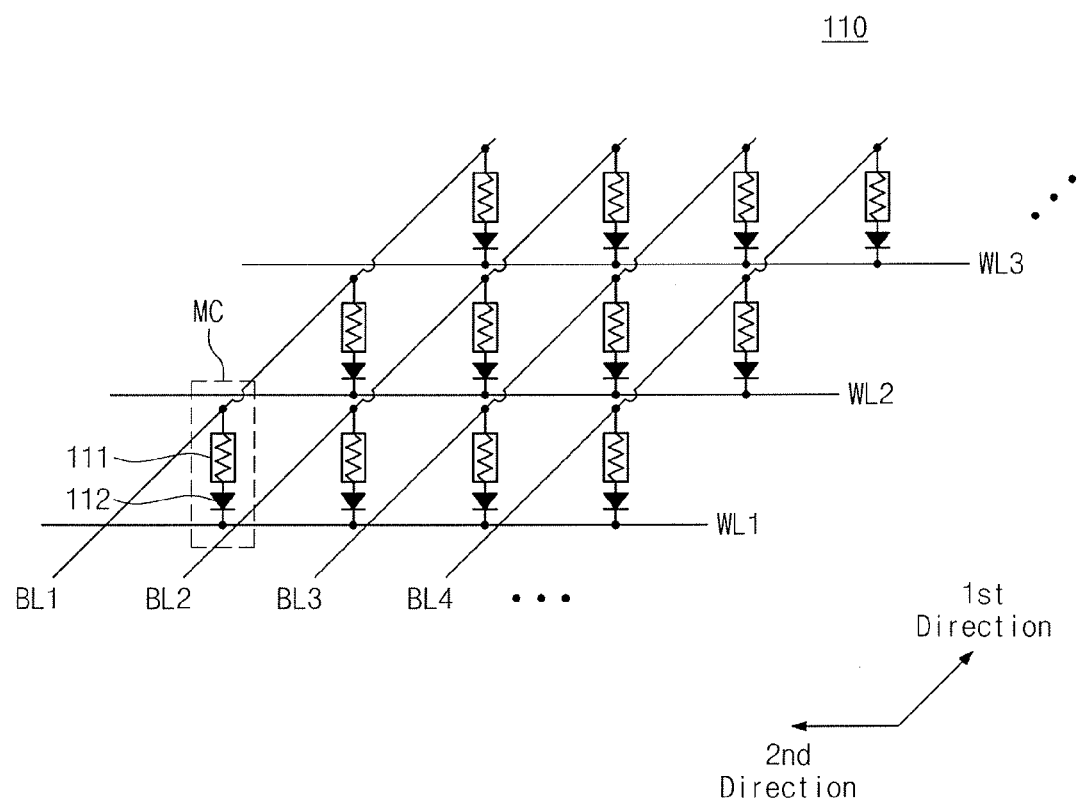
FIG. 6 is a diagram illustrating the memory cell array of FIG. 1 in accordance with an embodiment of the present inventive concept.

FIG. 6 is a diagram illustrating the memory cell array of FIG. 1 in accordance with an embodiment of the present inventive concept. Referring to FIG. 6, the memory cell array 110 may have a cross point structure. The cross point structure means a structure in which a memory cell is formed in an area where a line and another line cross each other.

For example, memory cells MC may be formed in areas where bit lines BL1~BL4 and word lines WL1~WL3 cross one another. The bit lines BL1~BL4 may extend in a first direction and the word lines WL1~WL3 may extend in a second direction to cross the bit lines BL1~BL4.

Figure 7:
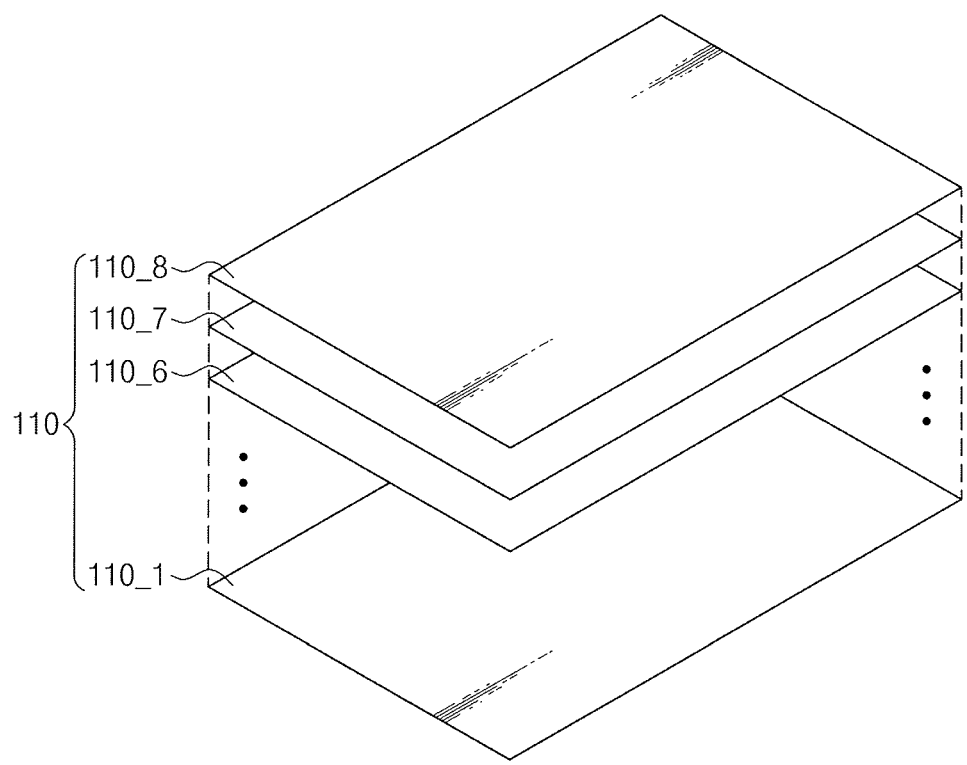
FIG. 7 is a diagram illustrating the memory cell array of FIG. 1 in accordance with an embodiment of the present inventive concept.

FIG. 7 is a diagram illustrating the memory cell array of FIG. 1 in accordance with an embodiment of the present inventive concept. Referring to FIG. 7, the memory cell array 110 may have a three-dimensional stacked structure. The three-dimensional stacked structure means a form in which a plurality of memory cell layers 110_1~110_8 are vertically stacked. In FIG. 7, eight memory cell layers 110_1~110_8 are illustrated but the present inventive concept is not limited to this example.

Each of the memory cell layers 110_1~110_8 may include multiple memory cell groups. In case that a memory cell array has a three-dimensional structure, each of the memory cell layers 110_1~110_8 may be the cross point structure illustrated in FIG. 6 but the present inventive concept is not limited thereto.

Figure 8:
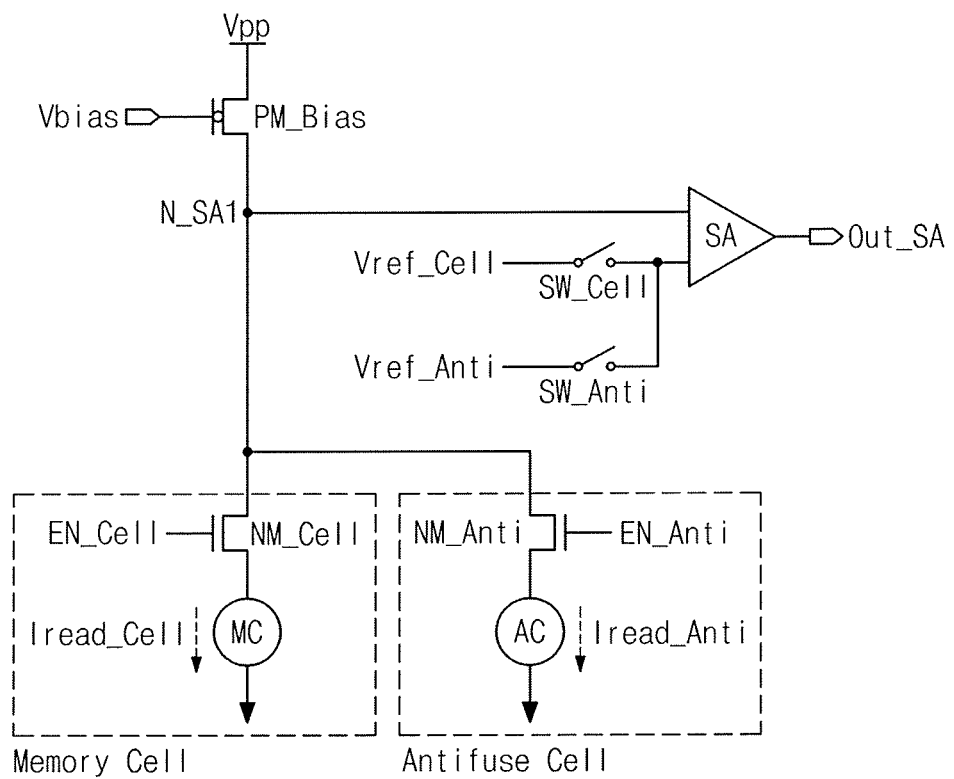
FIG. 8 is a circuit diagram of a memory cell, an anti-fuse cell, and a sense amplifier of FIG. 2 in accordance with an embodiment of the present inventive concept.

FIG. 8 is a circuit diagram of a memory cell, an anti-fuse cell and a sense amplifier of FIG. 2 in accordance with an embodiment of the present inventive concept. Referring to FIG. 8, the memory cell MC can share the sense amplifier SA with the anti-fuse cell AC. In FIG. 8, a case that one of the memory cells MC and one of the anti-fuse cells AC are connected to one of the sense amplifiers SA is described.

The memory cell MC and the anti-fuse cell AC can be connected to a node N_SA1 in parallel. The memory cell MC can be selected by a transistor NM_Cell. The transistor NM_Cell means select transistors of a word line WL and a bit line BL for selecting the memory cell MC. The transistor NM_Cell can be selected according to a decoded address ADDR. If a memory cell select signal EN_Cell is applied to the transistor NM_Cell, the memory cell MC may be selected. If the memory cell MC is selected, a memory read current Iread_Cell may flow through a bit line BL according to data stored in the memory cell MC.

The anti-fuse cell AC can be selected by a transistor NM_Anti. The transistor NM_Anti means select transistors of a word line WL and a bit line BL for selecting the anti-fuse cell AC. The transistor NM_Anti can be selected by a direction of the control logic 153 (FIG. 1). If an anti-fuse cell select signal EN_Anti is applied to the transistor NM_Anti, the anti-fuse cell AC can be selected. If the anti-fuse cell AC is selected, an anti-fuse read current Iread_Anti may flow through a bit line BL according to data stored in the anti-fuse cell AC.

The sense amplifier SA can compare a voltage generated by a current flowing through the node N_SA1 with a reference voltage Vref to output a sense amplifier output signal Out_SA. The sense amplifier output signal Out_SA may be data stored in the memory cell MC or the anti-fuse cell AC. A reference voltage for sensing the memory cell MC may be different from a reference voltage for sensing the anti-fuse cell AC. Thus, a reference voltage may be differently supplied depending on whether the memory cell MC is selected or whether the anti-fuse cell AC is selected. For example, in case that the memory cell MC is selected, the memory switch SW_Cell may be turned on. In this case, a memory reference voltage Vref_Cell may be supplied to the sense amplifier SA. In case that the anti-fuse cell AC is selected, an anti-fuse switch SW_Cell may be turned on. In this case, an anti-fuse reference voltage Vref_Anti may be supplied.

A bias transistor PM_Bias can supply a bias current to the node N_SA1. If a bias voltage is applied, the bias transistor PM_Bias can supply a bias current for operation of the sense amplifier SA.

In the nonvolatile memory device 100, the memory cell MC and the anti-fuse cell AC can be connected to one bit line BL in parallel. The memory cell MC and the anti-fuse cell AC can share one sense amplifier SA. Thus, a separate sense amplifier for the anti-fuse cell AC may not be needed. An area of the nonvolatile memory device 100 can be reduced by an amount corresponding to an area of a separate sense amplifier for the anti-fuse cell AC. The nonvolatile memory device 100 according to an embodiment of the present inventive concept can use sense amplifiers included in the sense amplifier 130 for the anti-fuse cell array 120, compared with a previous case of using sense amplifiers less than sense amplifiers included in the sense amplifier 130 for the anti-fuse cell array 120. Thus, a read-out time of data stored in the anti-fuse cell array 120 can be shortened. An operation speed of the nonvolatile memory device 100 may become high.

Figure 9:
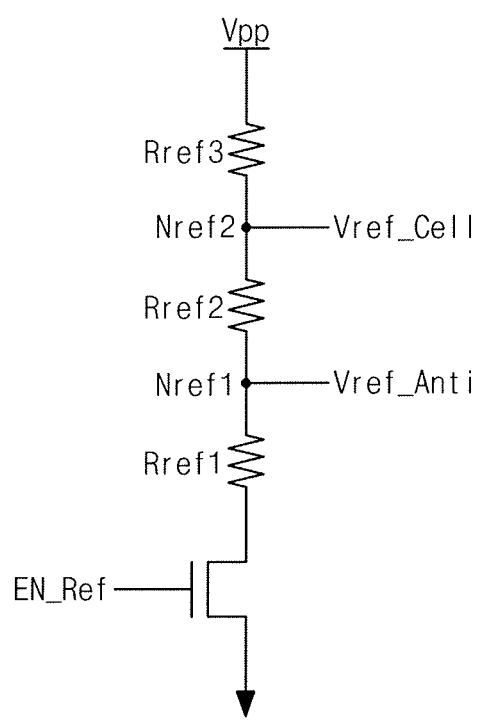
FIG. 9 is a circuit for supplying a reference voltage of FIG. 8 in accordance with an embodiment of the present inventive concept.

FIG. 9 is a circuit for supplying a reference voltage of FIG. 8 in accordance with an embodiment of the present inventive concept. Referring to FIG. 9, a reference voltage supply circuit may include first through third reference resistances Rref1, Rref2, and Rref3. The reference voltage supply circuit can supply the memory reference voltage Vref_Cell and the anti-fuse reference voltage Vref_Anti according to a reference voltage supply signal EN_Ref. The memory reference voltage Vref_Cell and the anti-fuse reference voltage Vref_Anti may be determined according to a ratio of the first through third reference resistances Rref1, Rref2, and Rref3. The memory and anti-fuse reference voltages Vref_Cell and Vref_Anti that are determined may be supplied to the sense amplifier SA, respectively, illustrated in FIG. 8. In FIG. 8, the memory and anti-fuse reference voltages Vref_Cell and Vref_Anti may be selectively supplied to the sense amplifier SA according to memory and anti-fuse switches SW_Cell and SW_Anti.

Figure 10:
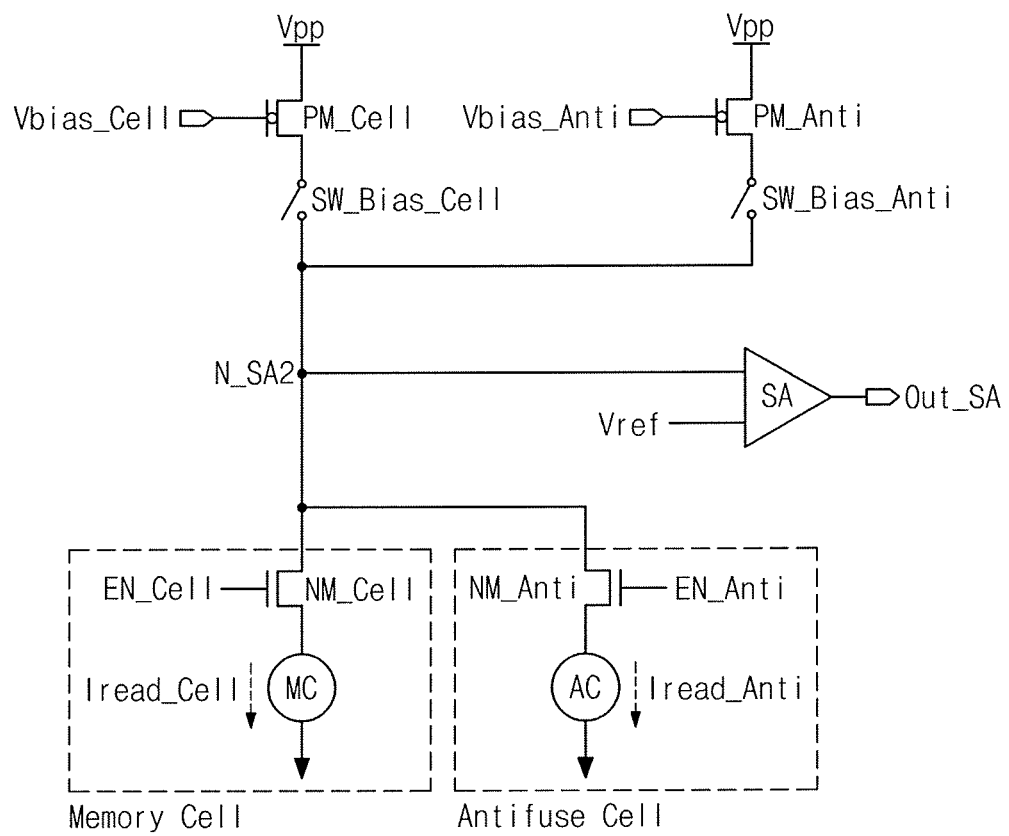
FIG. 10 is a circuit diagram of a memory cell, an anti-fuse cell, and a sense amplifier of FIG. 2 in accordance with an embodiment of the present inventive concept.

FIG. 10 is a circuit diagram of a memory cell, an anti-fuse cell, and a sense amplifier of FIG. 2 in accordance with an embodiment of the present inventive concept. Referring to FIG. 10, the memory cell MC can share the sense amplifier SA with the anti-fuse cell AC. In FIG. 8, a case that one of the memory cells MC and one of the anti-fuse cells AC are connected to one of the sense amplifiers SA is described.

The memory cell MC and the anti-fuse cell AC can be connected to a node N_SA2 in parallel. The memory cell MC can be selected by a transistor NM_Cell. The transistor NM_Cell means select transistors of a word line WL and a bit line BL for selecting the memory cell MC. The transistor NM_Cell can be selected according to a decoded address ADDR. If a memory cell select signal EN_Cell is applied to the transistor NM_Cell, the memory cell MC may be selected. If the memory cell MC is selected, a memory read current Iread_Cell may flow through a bit line BL according to data stored in the memory cell MC.

The anti-fuse cell AC can be selected by a transistor NM_Anti. The transistor NM_Anti means select transistors of a word line WL and a bit line BL for selecting the anti-fuse cell AC. The transistor NM_Anti can be selected by a direction of the control logic 153 (FIG. 1). If an anti-fuse cell select signal EN_Anti is applied to the transistor NM_Anti, the anti-fuse cell AC can be selected. If the anti-fuse cell AC is selected, an anti-fuse read current Iread_Anti may flow through a bit line BL according to data stored in the anti-fuse cell AC.

The sense amplifier SA can compare a voltage generated by a current flowing through the node N_SA2 with a reference voltage Vref to output a sense amplifier output signal Out_SA. The sense amplifier output signal Out_SA may be data stored in the memory cell MC or the anti-fuse cell AC.

In case of using the same reference voltage Vref to sense the memory cell MC and the anti-fuse cell AC, different bias currents may be used to sense the memory cell MC and the anti-fuse cell AC. Thus, a memory bias transistor PM_Cell and an anti-fuse bias transistor PM_Anti may be selectively used to supply a bias current to the node N_SA2.

In case that the memory cell MC is selected, a memory bias switch SW_Bias_Cell may be turned on. If the memory bias switch SW_Bias_Cell is turned on, the memory bias transistor PM_Cell can supply a memory bias current to the node N_SA2. A memory bias voltage Vbias_Cell is applied, the memory bias transistor PM_Cell can supply a memory bias current for an operation of the sense amplifier SA.

In case that the anti-fuse cell AC is selected, an anti-fuse bias switch SW_Bias_Anti may be turned on. If the anti-fuse bias switch SW_Bias_Anti is turned on, the anti-fuse bias transistor PM_Anti can supply an anti-fuse bias current to the node N_SA2. If an anti-fuse bias voltage Vbias_Anti is applied, the anti-fuse bias transistor PM_Anti can supply an anti-fuse bias current for an operation of the sense amplifier SA.

In the nonvolatile memory device 100, the memory cell MC and the anti-fuse cell AC can be connected to one bit line BL in parallel. The memory cell MC and the anti-fuse cell AC can share one sense amplifier SA. Thus, a separate sense amplifier for the anti-fuse cell AC may not be needed. An area of the nonvolatile memory device 100 can be reduced by an amount corresponding to an area of a separate sense amplifier for the anti-fuse cell AC. The nonvolatile memory device 100 according to an embodiment of the present inventive concept can use sense amplifiers included in the sense amplifier 130 for the anti-fuse cell array 120, compared with a previous case of using sense amplifiers less than sense amplifiers included in the sense amplifier 130 for the anti-fuse cell array 120. Thus, a read-out time of data stored in the anti-fuse cell array 120 can be shortened. An operation speed of the nonvolatile memory device 100 may become high.

Figure 11:
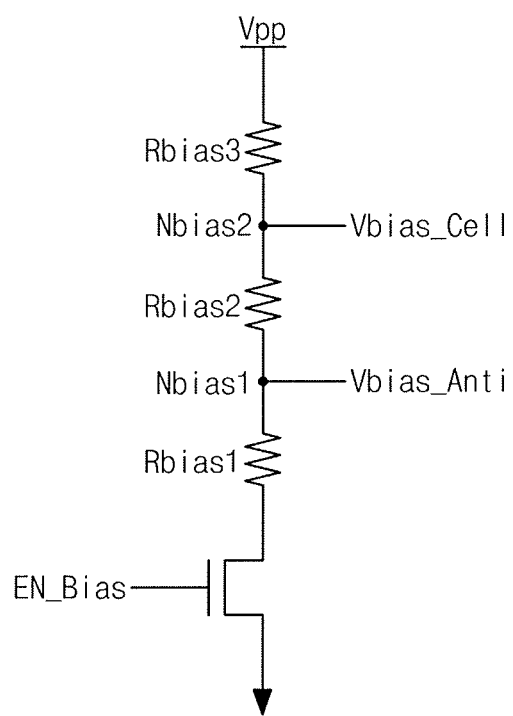
FIG. 11 is a circuit for supplying a bias voltage of FIG. 10 in accordance with an embodiment of the present inventive concept.

FIG. 11 is a circuit for supplying a bias voltage of FIG. 10 in accordance with an embodiment of the present inventive concept. Referring to FIG. 11, a bias voltage supply circuit may include first through third bias resistances Rbias1, Rbias2, and Rbias3. The bias voltage supply circuit can supply the memory bias voltage V bias_Cell and the anti-fuse bias voltage V bias_Anti according to a bias voltage supply signal EN_Vias. The memory bias voltage V bias_Cell and the anti-fuse bias voltage V bias_Anti may be determined according to a ratio of the first through third bias resistances Rbias1, Rbias2, and Rbias3. The memory and anti-fuse bias voltage V bias_Cell and V bias_Anti that are determined may be supplied to the memory and anti-fuse bias transistors PM_Cell and PM_Anti, respectively, illustrated in FIG. 10. In FIG. 10, the memory and anti-fuse bias transistors PM_Cell and PM_Anti may be selectively supplied to the node N_SA2 according to memory and anti-fuse bias switches SW_Bias_Cell and SW_Bias_Anti.

Figure 12:
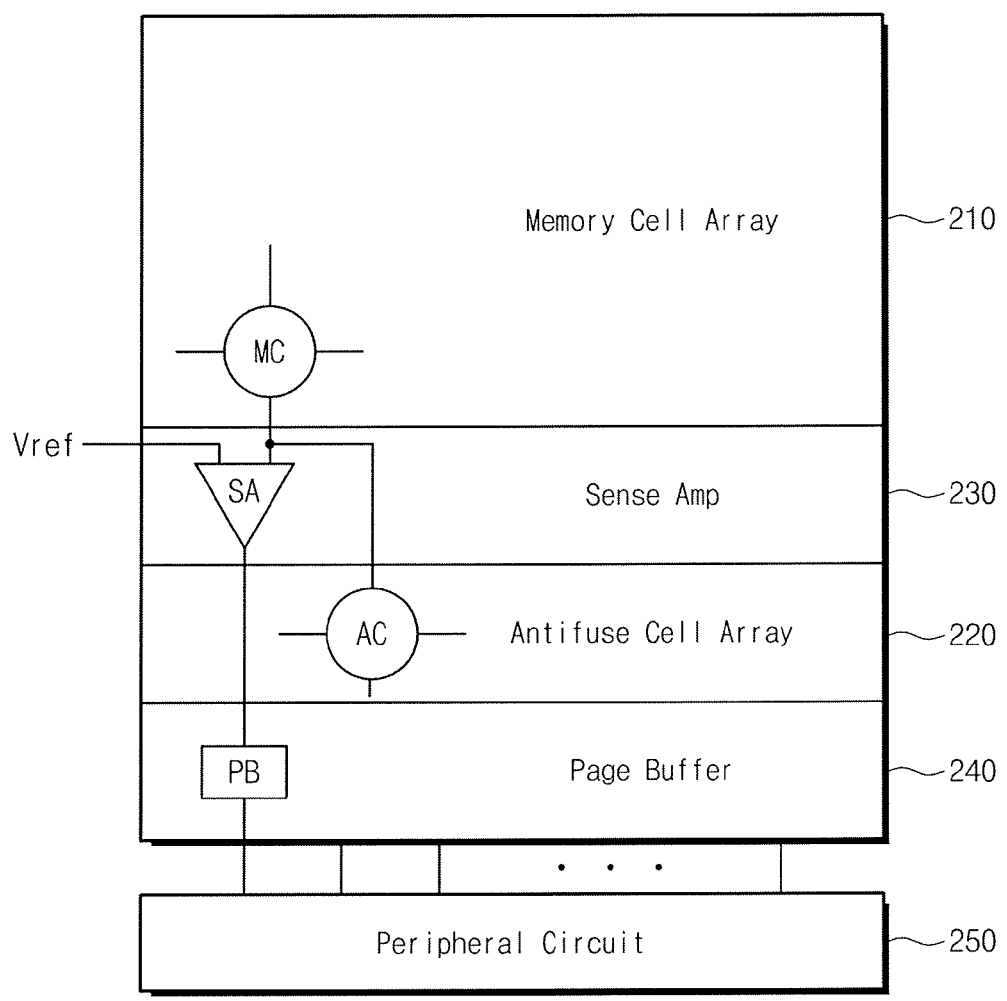
FIG. 12 is a top plan view illustrating the nonvolatile memory device of FIG. 1 in accordance with an embodiment of the present inventive concept.

FIG. 12 is a top plan view illustrating the nonvolatile memory device of FIG. 1 in accordance with an embodiment of the present inventive concept. Referring to FIG. 12, a nonvolatile memory device 200 may include a memory cell array 210, an anti-fuse cell array 220, a sense amplifier 230, a page buffer 240, and a peripheral circuit 250.

The sense amplifier 230 may be located between the memory cell array 210 and the anti-fuse cell array 220 on a substrate. A memory cell MC and an anti-fuse cell AC can share one bit line BL. Thus, data stored in the memory cell MC and the anti-fuse cell AC can be read out through one sense amplifier SA. Since a separate sense amplifier for the anti-fuse cell AC is not needed, an area of the nonvolatile memory device 200 can be reduced. Data stored in the memory cell MC or the anti-fuse cell AC can be read out by comparing a reference voltage Vref with a voltage or a current of the memory cell MC or the anti-fuse cell AC. The read out data can be transmitted to the peripheral circuit 250 through a corresponding buffer page BP. The read out data can be output to an external device through the data input/output circuit 251 of the peripheral circuit 250.

Figure 13:
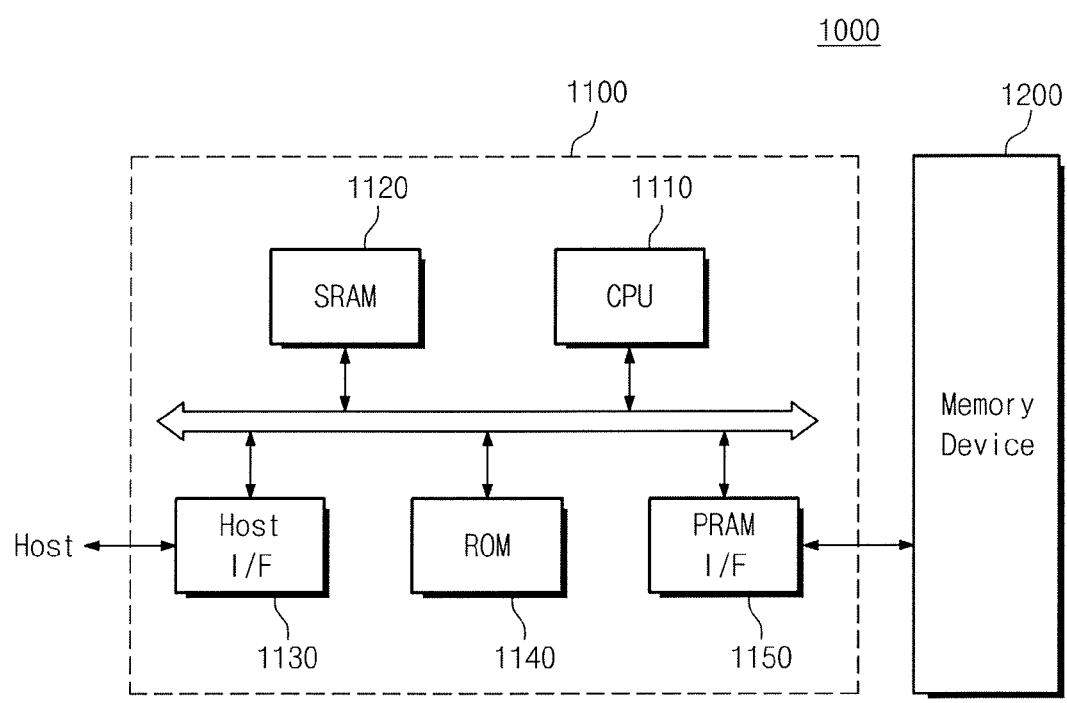
FIG. 13 is a block diagram of a memory system in accordance with an embodiment of the present inventive concept.

FIG. 13 is a block diagram of a memory system in accordance with an embodiment of the present inventive concept. Referring to FIG. 13, the memory system 1000 may include a memory controller 1100 and a memory device 1200.

The memory device 1200 may have substantially the same structure as the nonvolatile memory device 100 of FIG. 1. Thus, a detailed description of the memory device 1200 is omitted. In the memory device 1200, a memory cell MC and an anti-fuse cell AC can be connected to one bit line in parallel. The memory cell MC and the anti-fuse cell AC can share one sense amplifier SA. Thus, a separate sense amplifier for the anti-fuse cell AC may not be needed. An area of the nonvolatile memory device 1200 can be reduced by an amount corresponding to an area of a separate sense amplifier for the anti-fuse cell AC. The nonvolatile memory device 1200 according to an embodiment of the present inventive concept can use sense amplifiers included in a sense amplifier for an anti-fuse cell array, compared with a previous case of using sense amplifiers less than sense amplifiers included in the sense amplifier for the anti-fuse cell array. Thus, a read-out time of data stored in the anti-fuse cell array can be shortened. An operation speed of the nonvolatile memory device 1200 may become high.

The memory controller 1100 may be configured to control the memory device 1200. For example, the memory controller 1100 may be configured to control read, write, erase, and/or background operations of the memory device 1200. The memory controller 1100 may include a central processing unit (CPU) 1110, an SRAM 1120, a host interface 1130, a ROM 1140, and a PRAM interface 1150.

The CPU 1110 can perform an overall control operation for a data exchange of the memory controller 1100. The CPU 1110 can be configured to drive a firmware stored in the ROM 1140. The SRAM 1120 can be used as a working memory of the CPU 1110. The host interface 1130 can include a data exchange protocol of the host being connected to the memory system 1000. The ROM 1140 can store code data for interfacing with the host. The PRAM interface 1150 can interface with the memory device 1200.

The memory controller 1100 may be configured to communicate with an external device (e.g., host) through one of various interface protocols such as a universal serial bus (USB), a multimedia card (MMC), a peripheral component interconnect express (PCI-E), a small computer system interface (SCSI), a serial attached SCSI (SAS), a serial advanced technology attachment (SATA), a parallel advanced technology attachment (PATA), an enhanced small disk interface (ESDI), and an integrated drive electronics (IDE).

The memory system 1000 can be provided based on a phase change memory. Accordingly, since constituent elements for controlling a flash memory such as a flash translation layer (FTL), an error-correcting code (ECC), etc. and constituent elements for controlling a buffer memory such as a buffer management unit are not required for the memory controller 1100, a configuration of the memory controller 1100 may become simpler.

The memory system 1000 can be applied to a computer, an ultra mobile PC (UMPC), a workstation, a net-book, a personal digital assistants (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device that transmits and receives data through a wireless channel, one of various electronic devices constituting a home network, or the like.

Figure 14:
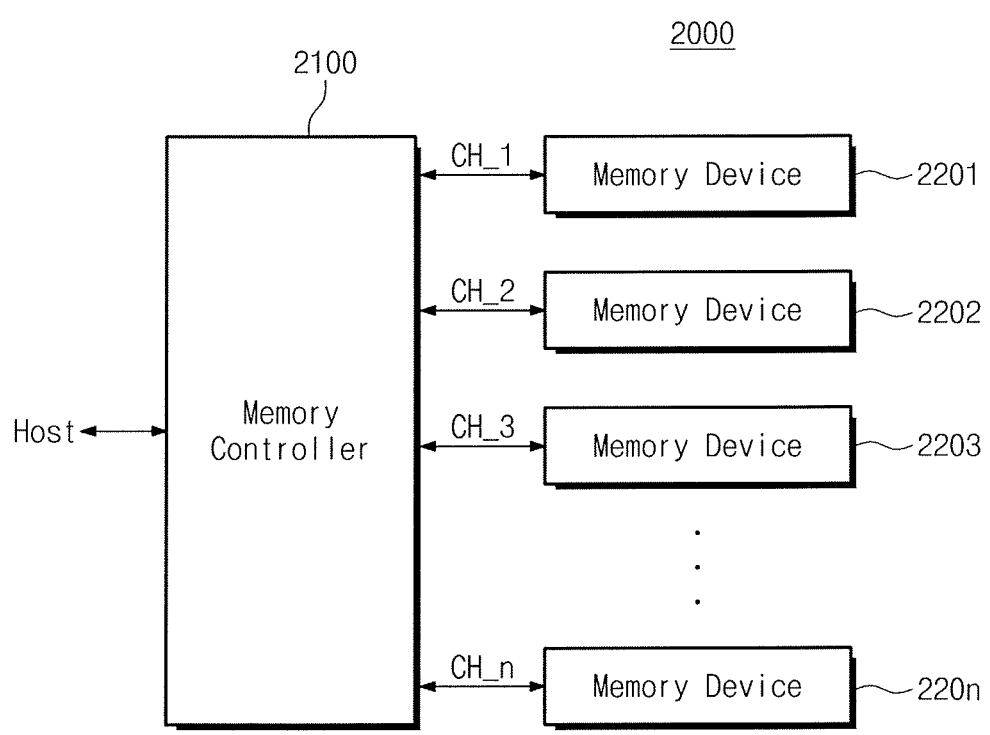
FIG. 14 is a block diagram of a memory system in accordance with an embodiment of the present inventive concept.

FIG. 14 is a block diagram of a memory system in accordance with an embodiment of the present inventive concept. The memory system 2000 may include a memory controller 2100 and a plurality of memory devices 2201~220n. The memory controller 2100 can receive a command from an external device (e.g., host, AP, etc.) and can control the plurality of memory devices 2201~220n on the basis of the received command.

The plurality of memory devices 2201~220n can operate according to a control of the memory controller 2100. The plurality of memory devices 2201~220n may be the nonvolatile memory device 100 described with reference to FIGS. 1 through 12. For example, in each of the plurality of memory devices 2201~220n, a memory cell MC and an anti-fuse cell AC can be connected to one bit line in parallel. The memory cell MC and the anti-fuse cell AC can share one sense amplifier SA. Thus, a separate sense amplifier for the anti-fuse cell AC may not be needed. An area of each of the plurality of memory devices 2201~220n can be reduced by an amount corresponding to an area of a separate sense amplifier for the anti-fuse cell AC. Each of the plurality of memory devices 2201~220n according to an embodiment of the present inventive concept can use sense amplifiers included in a sense amplifier for an anti-fuse cell array, compared with a previous case of using sense amplifiers less than sense amplifiers included in the sense amplifier for the anti-fuse cell array. Thus, a read-out time of data stored in the anti-fuse cell array can be shortened. An operation speed of each of the plurality of memory devices 2201~220n may become higher.

The plurality of memory devices 2201~220n may be different semiconductor chips. A plurality of semiconductor chips may be provided in one package using a multi-chip packaging technology (MCP).

According to an embodiment of the present inventive concept described above, the memory system 2000 may use a phase change memory. Thus, since the memory controller 2100 does not include constituent elements for controlling a flash memory such as an FTL, an ECC, etc. and constituent elements for controlling a buffer memory such as a buffer management unit, a configuration of the memory controller 2100 may become simpler.

Figure 15:
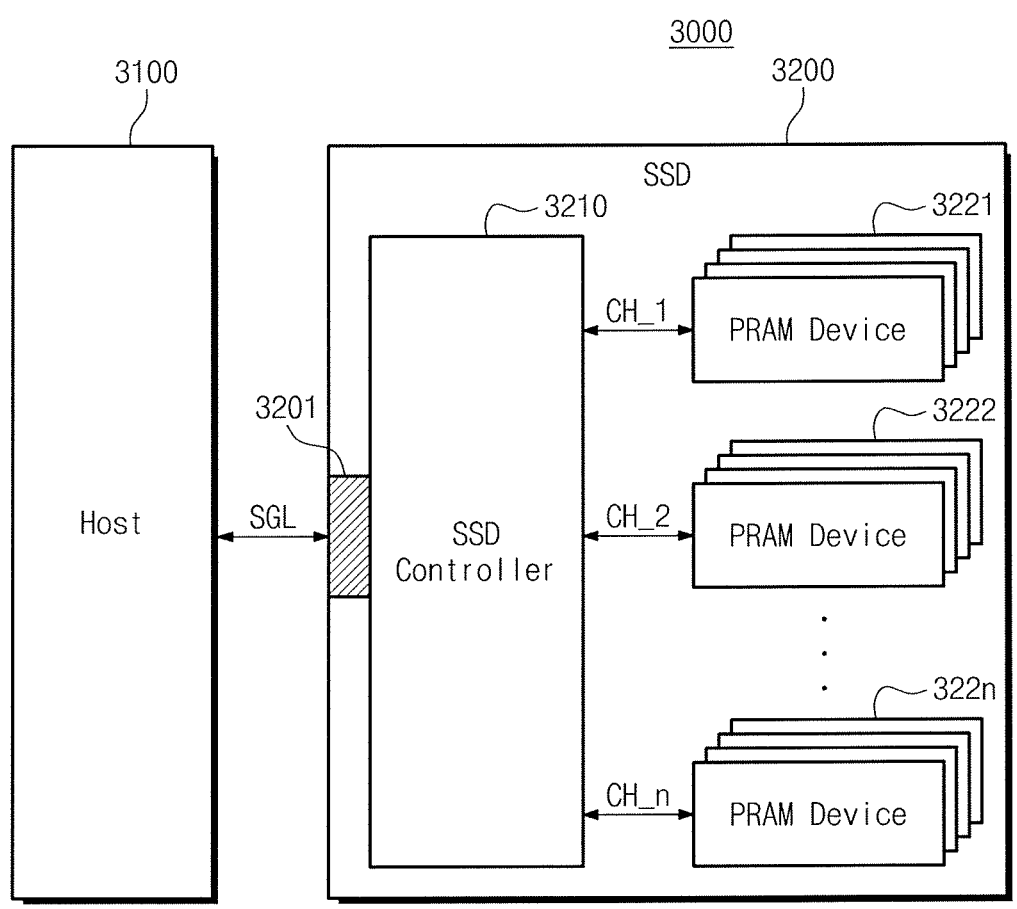
FIG. 15 is a block diagram of a solid state drive (SSD) system to which the memory system according to an embodiment of the present inventive concept is applied.

FIG. 15 is a block diagram of a solid state drive (SSD) system to which the memory system according to an embodiment of the present inventive concept is applied. Referring to FIG. 15, the SSD system 3000 may include a host 3100 and an SSD 3200.

The SSD 3200 may exchange a signal with the host 3100 through a signal connector 3201. The SSD 3200 may include a plurality of memory devices 3221~322n and an SSD controller 3210. The plurality of memory devices 3221~322n and the SSD controller 3210 may be the nonvolatile memory device and the memory controller described with reference to FIGS. 1 through 14, respectively.

For example, in each of the plurality of memory devices 3221~322n, a memory cell MC and an anti-fuse cell AC can be connected to one bit line BL in parallel. The memory cell MC and the anti-fuse cell AC can share one sense amplifier SA. Thus, a separate sense amplifier for the anti-fuse cell AC may not be needed. An area of each of the memory devices 3221~322n can be reduced by an amount corresponding to an area of a separate sense amplifier for the anti-fuse cell AC. Each of the plurality of memory devices 3221~322n according to an embodiment of the present inventive concept can use sense amplifiers included in a sense amplifier for an anti-fuse cell array, compared with a previous case of using sense amplifiers less than sense amplifiers included in the sense amplifier for the anti-fuse cell array. Thus, a read-out time of data stored in the anti-fuse cell array can be shortened. An operation speed of each of the memory devices 3221~322n may become higher.

The SSD 3200 may be constituted by a nonvolatile memory device such as a PRAM, an MRAM, a resistive random access memory (ReRAM), an FRAM, etc. The plurality of memory devices 3221~322n can be connected to the SSD controller 3210 through a plurality of channels CH1~CHn. One or more memory devices can be connected to one channel. Memory devices connected to one channel can be connected to the same data bus.

The SSD controller 3210 may exchange a signal SGL with the host 3100 through the signal connector 3201. The signal SGL may include a command, an address, data, etc. The SSD controller 3210 may write data in a corresponding memory device or read data from a corresponding memory device according to a command of the host 3100.

Figure 16:
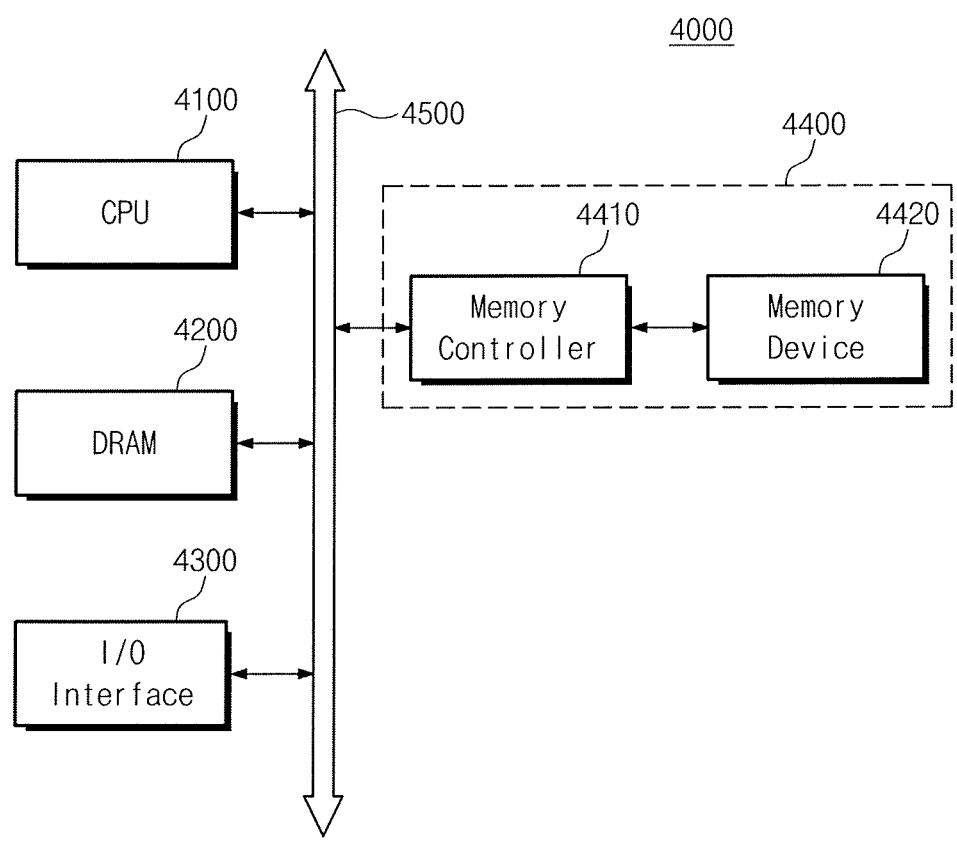
FIG. 16 is a block diagram of a user system in accordance with an embodiment of the present inventive concept.

FIG. 16 is a block diagram of a user system in accordance with an embodiment of the present inventive concept. For example, a user system 4000 may be one of computing systems such as a personal computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player, etc.

Referring to FIG. 16, the user system 4000 may include a CPU 4100, a DRAM 4200, an input/output interface 4300, a memory system 4400, and a system bus 4500. The CPU 4100 can control an overall operation of the user system 4400. The DRAM 4200 may be a main memory of the user system 4000 and can be used as a working memory or a buffer memory. The input/output interface 4300 may include various interfaces of inputting or outputting data and a control signal such as a keyboard, a display, a touch screen, a mouse, etc.

The memory system 4400 may include a memory controller 4410 and a memory device 4420. The memory system 4400 may include devices described with reference to FIGS. 1 through 14.

For example, in the memory device 4420, a memory cell MC and an anti-fuse cell AC can be connected to one bit line in parallel. The memory cell MC and the anti-fuse cell AC can share one sense amplifier SA. Thus, a separate sense amplifier for the anti-fuse cell AC may not be needed. An area of the nonvolatile memory device 4420 can be reduced by an amount corresponding to an area of a separate sense amplifier for the anti-fuse cell AC. The nonvolatile memory device 4420 according to an embodiment of the present inventive concept can use sense amplifiers included in a sense amplifier for an anti-fuse cell array, compared with a previous case of using sense amplifiers less than sense amplifiers included in the sense amplifier for the anti-fuse cell array. Thus, a read-out time of data stored in the anti-fuse cell array can be shortened. An operation speed of the nonvolatile memory device 4420 may become high.

The system bus 4500 can provide a transmission channel for transmitting and receiving data and a signal between constituent elements of the user system 4000.

According to an embodiment of the present inventive concept, the memory system 4400 may be provided based on a phase change memory. Since constituent elements such as an FTL, an ECC, a buffer management unit, etc. are not needed when using the phase change memory as the memory device 4420, a constituent of the memory controller 4410 may become simple.

According to an embodiment of the present inventive concept, a nonvolatile memory device and a memory system including the nonvolatile memory device may be provided. In the nonvolatile memory device, an anti-fuse cell array and a memory cell array may share sense amplifiers, and thus, an area of the nonvolatile memory device may be reduced and a read out time of data stored in the anti-fuse cell array may be shortened.

The foregoing is illustrative of embodiments of the present inventive concept and is not to be construed as limited thereof. Although a few embodiments have been described, those skilled in the art will readily appreciate that many modifications in form and detail may be possible therein without materially departing from the spirit and scope of the present inventive concept.

What is claimed is:

1. A nonvolatile memory device comprising:
a memory cell array including memory cells connected to word lines and bit lines;
an anti-fuse cell array configured to store setting information for controlling the memory cell array, the anti-fuse cell array including anti-fuse cells connected to the bit lines;
a sense amplifier connected to the bit lines, the sense amplifier being configured to sense the memory cells or the anti-fuse cells;
a page buffer configured to store data that is read out from the memory cells or from the anti-fuse cells;
a control logic configured to control the sense amplifier and the page buffer to read out the data from the memory cells or the anti-fuse cells;
a reference voltage supply circuit configured to supply a same reference voltage to the sense amplifier irrespective of whether the data stored in the memory cells are read or the data stored in the anti-fuse cells are read; and
a bias current supply circuit configured to supply a first bias current to the sense amplifier when the data stored in the memory cells are read, and to supply a second bias current different from the first bias current to the sense amplifier when the data stored in the anti-fuse cells are read.

2. The nonvolatile memory device of claim 1, wherein the anti-fuse cell array is located between the memory cell array and the sense amplifier on a substrate.

3. The nonvolatile memory device of claim 1, wherein the sense amplifier is located between the memory cell array and the anti-fuse cell array on a substrate.

4. The nonvolatile memory device of claim 1, further comprising a bias voltage supply circuit configured to supply a first bias voltage to the bias current supply circuit when the data stored in the memory cells are read.

5. The nonvolatile memory device of claim 4, wherein the bias voltage supply circuit is configured to supply a second bias voltage to the bias current supply circuit when the data stored in the anti-fuse cells are read,
wherein the second bias voltage is different from the first bias voltage.

6. A memory system comprising a nonvolatile memory device and a memory controller configured to control the nonvolatile memory device,
wherein the nonvolatile memory device includes:
a memory cell array including a plurality of memory cells connected to word lines and bit lines;
an anti-fuse cell array configured to store setting information for controlling the memory cell array, the anti-fuse cell array including a plurality of anti-fuse cells connected to the bit lines, the plurality of anti-fuse cells being configured to store information with respect to failed memory cells of the memory cell array;
a sense amplifier connected to the bit lines, the sense amplifier being configured to sense the plurality of memory cells or the plurality of anti-fuse cells;
a page buffer configured to store data that is read out from the plurality of memory cells or from the plurality of anti-fuse cells;
a control logic configured to control the sense amplifier and the page buffer to read out the data from the memory cells or the anti-fuse cells, the control logic being configured to perform a repair operation of the memory cell array based on the information stored in the plurality of anti-fuse cells;
a reference voltage supply circuit configured to supply a same reference voltage to the sense amplifier irrespective of whether the data stored in the memory cells are read or the data stored in the anti-fuse cells are read; and
a bias current supply circuit configured to supply a first bias current to the sense amplifier when the data stored in the memory cells are read, and to supply a second bias current different from the first bias current to the sense amplifier when the data stored in the anti-fuse cells are read.

7. The memory system of claim 6, wherein each of the plurality of memory cells comprises a memory element and a select element.

8. The memory system of claim 6, wherein the nonvolatile memory device further includes an address decoder configured to select one of the word lines according to address information when the data stored in the memory cells are read.

9. The memory system of claim 8, wherein the sense amplifier is configured to sense the data stored in memory cells connected to the selected word line among the plurality of memory cells.

10. The memory system of claim 6, wherein the control logic is configured to select one of anti-fuse word lines connected to the plurality of anti-fuse cells according to address information when the data stored in the anti-fuse cells are read.

11. The memory system of claim 10, wherein the sense amplifier is configured to sense the data stored in anti-fuse cells connected to the selected anti-fuse word line among the plurality of anti-fuse cells.

12. A solid state drive comprising a nonvolatile memory device and a controller configured to control the nonvolatile memory device,
wherein the nonvolatile memory device includes:
a memory cell array;
a sense amplifier configured to sense data stored in a plurality of memory cells of the memory cell array;
an anti-fuse cell array including a plurality of anti-fuse cells configured to store control information for controlling the memory cell array, the anti-fuse cell array being configured to share the sense amplifier with the memory cell array;
a control logic configured to control the sense amplifier to read out data from the memory cells or the anti-fuse cells;
a reference voltage supply circuit configured to supply a same reference voltage to the sense amplifier irrespective of whether the data stored in the memory cells are read or the data stored in the anti-fuse cells are read; and
a bias current supply circuit configured to supply a first bias current to the sense amplifier when the data stored in the memory cells are read, and to supply a second bias current different from the first bias current to the sense amplifier when the data stored in the anti-fuse cells are read.

13. The solid state drive of claim 12, wherein the sense amplifier is connected to at least one of the plurality of memory cells in the memory cell array and at least one of the plurality of anti-fuse cells in the anti-fuse cell array.

14. The solid state drive of claim 13, wherein the control logic is configured to select one of anti-fuse word lines connected to the plurality of anti-fuse cells according to address information when the data stored in at least one of the plurality of anti-fuse cells is read.

15. The solid state drive of claim 14, wherein the sense amplifier is configured to sense the data stored in anti-fuse cells connected to the selected anti-fuse word line among the plurality of anti-fuse cells.

16. The solid state drive of claim 12, wherein the control information is unchanged after the anti-fuse cell array is programmed once.

* * * * *